United States Patent
Sato et al.

(10) Patent No.: US 7,372,066 B2
(45) Date of Patent: May 13, 2008

(54) GALLIUM NITRIDE COMPOUND SEMICONDUCTOR DEVICE AND MANUFACTURING METHOD

(75) Inventors: Hisao Sato, Tokushima (JP); Tomoya Sugahara, Tokushima (JP); Shinji Kitazawa, Tokushima (JP); Yoshihiko Muramoto, Tokushima (JP); Shiro Sakai, Tokushima (JP)

(73) Assignee: Nitride Semiconductors Co., Ltd., Tokushima (JP)

( * ) Notice: Subject to any disclaimer, the term of this patent is extended or adjusted under 35 U.S.C. 154(b) by 235 days.

(21) Appl. No.: 10/516,703

(22) PCT Filed: Jun. 4, 2003

(86) PCT No.: PCT/JP03/07061

§ 371 (c)(1),
(2), (4) Date: Dec. 2, 2004

(87) PCT Pub. No.: WO03/103062

PCT Pub. Date: Dec. 11, 2003

(65) Prior Publication Data

US 2006/0175600 A1     Aug. 10, 2006

(30) Foreign Application Priority Data

Jun. 4, 2002    (JP)    ............................. 2002-162646

(51) Int. Cl.
H01L 29/06    (2006.01)

(52) U.S. Cl. ............................ 257/14; 257/15; 257/79; 257/88; 257/92; 257/98

(58) Field of Classification Search .................. 257/79, 257/88, 92, 98, 14, 15
See application file for complete search history.

(56) References Cited

U.S. PATENT DOCUMENTS 6,325,850 B1    12/2001    Beaumont et al.
7,095,051 B2*    8/2006    Nagahama et al. ............ 257/79

FOREIGN PATENT DOCUMENTS

EP    1 128 446 A2    8/2001

(Continued)

OTHER PUBLICATIONS esp@cenet document bibliography and Abstract for Japanese Publication No. 2001-007447, published Jan. 12, 2001.

(Continued)

*Primary Examiner*—Evan Pert
*Assistant Examiner*—Tan Tran
(74) *Attorney, Agent, or Firm*—Osha Liang LLP (57) ABSTRACT

A light-emitting element using GaN. On a substrate (10), formed are an SiN buffer layer (12), a GaN buffer layer (14), an undoped GaN layer (16), an Si-doped n-GaN layer (18), an SLS layer (20), an undoped GaN layer (22), an MQW light-emitting layer (24), an SLS layer (26), and a p-GaN layer (28), forming a p electrode (30) and an n electrode (32). The MQW light-emitting layer (24) has a structure in which InGaN well layers and AlGaN barrier layers are alternated. The Al content ratios of the SLS layers (20, and 26) are more than 5% and less than 24%. The In content ratio of the well layer in the MQW light-emitting layer (24) is more than 3% and less than 20%. The Al content ratio of the barrier layer is more than 1% and less than 30%. By adjusting the content ratio and film thickness of each layer to a desired value, the light luminous efficiency for wavelength of less than 400 nm is improved.

9 Claims, 3 Drawing Sheets

FOREIGN PATENT DOCUMENTS

| | | | |
|---|---|---|---|
| JP | 10-12610 A | 5/1998 |
| JP | 10-303458 | 11/1998 |
| JP | 11-251684 A | 9/1999 |
| JP | 11-307866 A | 11/1999 |
| JP | 2000-216432 A | 8/2000 |
| JP | 2000-299532 | * | 10/2000 |
| JP | 2000-299532 A | 10/2000 |
| JP | 2001-7447 A | 1/2001 |
| JP | 2001-102678 A | 4/2001 |
| JP | 2002-141553 A | 5/2002 |

OTHER PUBLICATIONS esp@cenet document bibliography and Abstract for Japanese Publication No. 2000-299532, published Oct. 24, 2000.

esp@cenet document bibliography and Abstract for Japanese Publication No. 11-307866, published Nov. 5, 1999.

esp@cenet document bibliography and Abstract for Japanese Publication No. 11-251684, published Sep. 17, 1999.

esp@cenet document bibliography and Abstract for Japanese Publication No. 10-126010, published May 15, 1998.

esp@cenet document bibliography and Abstract for Japanese Publication No. 2002-141553, published May 17, 2002.

esp@cenet document bibliography and Abstract for Japanese Publication No. 2001-102678, published Apr. 13, 2001.

esp@cenet document bibliography and Abstract for Japanese Publication No. 2000-216432, published Aug. 4, 2000.

Office Action dated Mar. 31, 2006 for Taiwan Patent Application Serial No. 092115038, with English translation (6 pages).

English Abstract of Japanese Patent Laid-Open Publication No. 10-303458, dated Nov. 13, 1998 (1 page).

European Search Report issued on Oct. 4, 2006 in the corresponding European patent application No. 03736016.1-2222, PCT/JP0307061, 3 pages.

Mary H. Crawford, et al. Design and Performance of Nitride-based UV LEDs, vol. 3938, 2000, pages 13-23, XP008060093 (cited in European Search Report), 11 pages.

Office Action issued by the European Patent Office on Dec. 27, 2006 in European Application No. 03 736 016.1-1235, 8 pages.

Chinese Office Action for Chinese patent application No. 038128918, issued Jan. 26, 2007, and English translation thereof, 19 pages.

* cited by examiner

GALLIUM NITRIDE COMPOUND SEMICONDUCTOR DEVICE AND MANUFACTURING METHOD

TECHNICAL FIELD

The present invention relates to a gallium nitride (GaN)-based compound semiconductor device and a manufacturing method thereof, and, in particular, to improvement in light emission efficiency.

BACKGROUND ART

Light emitting elements which use a nitride semiconductor and have a wavelength band of 370 nm-550 nm have been made commercially available. In these light emitting elements, $In_xGa_{1-x}N$ (0<x<1) is used as a light emitting material. The light emission wavelength changes when a compositional ratio of In in $In_xGa_{1-x}N$ is changed. Specifically, the light emission wavelength is increased as x is increased. When the compositional ratio x of In is changed, the light emission efficiency also changes in addition to the light emission wavelength. More specifically, when the compositional ratio x of In is increased too much, because (1) a difference in lattice constants between InGaN and the layers sandwiching InGaN, that is, between InGaN and GaN or between InGaN and AlGaN, becomes large and (2) a crystal growth temperature must be reduced in order to grow crystal of InGaN having a high composition of In, the crystal quality of InGaN is degraded and the light emission efficiency is reduced when the wavelength exceeds 530 nm. In general, in a wavelength range of 400 nm-530 nm, the light emission efficiency is increased, but the light emission efficiency is reduced when the wavelength is 400 nm or smaller.

A reason why the light emission efficiency at a shorter wavelength side of 400 nm or smaller is reduced may be considered to be due to dislocations present in the crystal. An efficiency of a light emitting element (LED or the like) having a wavelength of 400 nm-530 nm having an arbitrary compositional ratio of In is high regardless of a dislocation density because of a fluctuation of In composition within the InGaN layer. More specifically, when there is a compositional fluctuation of In, light is emitted at a local region in which the In composition is large and the injected carriers are captured in this local region. As a consequence, the carriers do not reach the dislocations and the efficiency is not reduced. As described above, in order to shorten the light emission wavelength, the compositional ratio x of In must be reduced, which inevitably results in reduction in the fluctuation of In composition. When the fluctuation in composition is small, the carriers are not sufficiently captured. As a consequence, the carriers reach the dislocations and the light emission efficiency is reduced.

As described, when the light emission wavelength is 400 nm or smaller, the light emission efficiency significantly depends on the dislocation density and is reduced due to the presence of dislocations.

In order to prevent reduction of light emission efficiency in a wavelength band of 400 nm or smaller, the dislocation density must be maintained at a low level. The dislocation density is reduced in the related art, for example, through an ELO (Epitaxial Lateral Overgrowth) method and a method in which a light emitting layer is grown on a sapphire substrate or the like onto which a groove is formed. However, because these methods require photolithography or the like, there had been a problem in that the manufacturing requires labor and the cost of the light emitting element is increased.

DISCLOSURE OF INVENTION

An object of the present invention is to provide a device having a superior light emission efficiency in a short wavelength range (in particular, in a wavelength range of 400 nm or shorter) without using a special method such as photolithography.

According to one aspect of the present invention, there is provided a gallium nitride-based compound semiconductor device comprising a substrate, a first superlattice layer which is formed above the substrate and in which an n-type AlGaN layer and an n-type GaN layer are alternately layered, a multiple quantum well layer which is formed above the first superlattice layer and in which a GaN-based quantum well layer and a GaN-based quantum barrier layer are alternately layered, and a second superlattice layer which is formed above the multiple quantum well layer and in which a p-type AlGaN layer and a p-type GaN layer are alternately layered.

According to another aspect of the present invention, it is preferable that, in the gallium nitride-based compound semiconductor device, a buffer layer, a first GaN-based layer, and an n-type GaN-based layer are provided between the substrate and the first superlattice layer, a second GaN-based layer is provided above the first superlattice layer, and a p-type GaN-based layer is provided above the second superlattice layer.

According to another aspect of the present invention, it is preferable that, in the gallium nitride-based compound semiconductor device, a compositional ratio of Al in the GaN-based quantum barrier layer in the multiple quantum well layer is larger than compositional ratios of Al in the first superlattice layer and the second superlattice layer.

According to another aspect of the present invention, it is preferable that, in the gallium nitride-based compound semiconductor device, each of compositional ratios of Al in the AlGaN layer in the first superlattice layer and in the second superlattice layer is 5% or greater and 25% or smaller, a compositional ratio of In in the InGaN quantum well layer or the AlInGaN quantum well layer in the multiple quantum well layer is 3% or greater and 20% or smaller, a compositional ratio of Al in the AlGaN quantum barrier layer or the AlInGaN quantum barrier layer in the multiple quantum well layer is 1% or greater and 30% or smaller, and a band gap of the quantum well layer is smaller than a band gap of the quantum barrier layer.

According to another aspect of the present invention, it is preferable that, in the gallium nitride-based compound semiconductor device, each of thicknesses of the AlGaN layer and the GaN layer in the first superlattice layer is 1 nm or greater and 10 nm or smaller, a thickness of the quantum well layer in the multiple quantum well layer is 1 nm or greater and 5 nm or smaller, a thickness of the quantum barrier layer in the multiple quantum well layer is 2 nm or greater and 50 nm or smaller, a thickness of the AlGaN layer in the second superlattice layer is 0.5 nm or greater and 10 nm or smaller, and a thickness of the GaN layer in the second superlattice layer is 0.5 nm or greater and 5 nm or smaller.

According to another aspect of the present invention, it is preferable that, in the gallium nitride-based compound semiconductor device, a thickness of the first GaN-based layer is 500 nm or greater and 3000 nm or smaller, a thickness of the n-type GaN-based layer is 500 nm or greater and 10000 nm or smaller, each of thicknesses of the AlGaN layer and the GaN layer in the first superlattice layer is 1 nm or greater and 10 nm or smaller, a thickness of the second GaN-based layer is 5 nm or greater and 100 nm or smaller, a thickness of the quantum well layer in the multiple quantum well layer is 1 nm or greater and 5 nm or smaller, a thickness of the quantum barrier layer in the multiple quantum well layer is 2 nm or greater and 50 nm or smaller, a thickness of the AlGaN layer in the second superlattice layer is 0.5 nm or greater and 10 nm or smaller, a thickness of the GaN layer in the second superlattice layer is 0.5 nm or greater and 5 nm or smaller, and a thickness of the p-type GaN-based layer is 5 nm or greater and 50 nm or smaller.

According to another aspect of the present invention, it is preferable that, in the gallium nitride-based compound semiconductor device, each of thicknesses of the AlGaN layer and the GaN layer in the first superlattice layer is 1.5 nm or greater and 5 nm or smaller, a thickness of the quantum well layer in the multiple quantum well layer is 1 nm or greater and 2 nm or smaller, a thickness of the quantum barrier layer in the multiple quantum well layer is 6 nm or greater and 20 nm or smaller, a thickness of the AlGaN layer in the second superlattice layer is 1 nm or greater and 6 nm or smaller, and a thickness of the GaN layer in the second superlattice layer is 0.5 nm or greater and 3 nm or smaller.

According to another aspect of the present invention, it is preferable that, in the gallium nitride-based compound semiconductor device, a thickness of the first GaN-based layer is 1500 nm or greater and 3000 nm or smaller, a thickness of the n-type GaN-based layer is 1000 nm or greater and 2000 nm or smaller, each of thicknesses of the AlGaN layer and the GaN layer in the first superlattice layer is 1.5 nm or greater and 5 nm or smaller, a thickness of the second GaN-based layer is 20 nm or greater and 40 nm or smaller, a thickness of the quantum well layer in the multiple quantum well layer is 1 nm or greater and 2 nm or smaller, a thickness of the quantum barrier layer in the multiple quantum well layer is 6 nm or greater and 20 nm or smaller, a thickness of the AlGaN layer in the second superlattice layer is 1 nm or greater and 6 nm or smaller, a thickness of the GaN layer in the second superlattice layer is 0.5 nm or greater and 3 nm or smaller, and a thickness of the p-type GaN-based layer is 10 nm or greater and 40 nm or smaller.

The gallium nitride-based compound semiconductor according to these aspects of the present invention can be manufactured through an MOCVD method. According to another aspect of the present invention, it is preferable that a manufacturing method comprises the steps of forming the buffer layer on the substrate at a temperature of 450° C. or higher and 600° C. or lower, sequentially forming the first GaN-based layer, the n-type GaN-based layer, and the first superlattice layer on the buffer layer at a temperature of 1050° C. or higher and 110° C. or lower, sequentially forming the second GaN-based layer and the multiple quantum well layer on the first superlattice layer at a temperature of 800° C. or higher and 900° C. or lower, and sequentially forming the second superlattice layer and the p-type GaN-based layer on the multiple quantum well layer at a temperature of 950° C. or higher and 1025° C. or lower.

According to another aspect of the present invention, there is provided a gallium nitride-based compound semiconductor device comprising a substrate, an n-type AlGaN layer which is formed above the substrate, a multiple quantum well layer which is formed above the n-type AlGaN layer and in which a GaN-based quantum well layer and a GaN-based quantum barrier layer are alternately layered, and a p-type AlGaN layer which is formed above the multiple quantum well layer.

According to another aspect of the present invention, it is preferable that, in the gallium nitride-based compound semiconductor device, a compositional ratio of Al in the GaN-based quantum barrier layer in the multiple quantum well layer is larger than compositional ratios of Al in the n-type AlGaN layer and the p-type AlGaN layer.

According to another aspect of the present invention, it is preferable that, in the gallium nitride-based compound semiconductor device, a buffer layer, a first GaN-based layer, and an n-type GaN-based layer are provided between the substrate and the n-type AlGaN layer, a second GaN-based layer is provided between the n-type AlGaN layer and the multiple quantum well layer, and a p-type GaN-based layer is provided above the p-type AlGaN layer.

According to another aspect of the present invention, it is preferable that, in the gallium nitride-based compound semiconductor device, each of compositional ratios of Al in the n-type AlGaN layer and in the p-type AlGaN layer is 5% or greater and 25% or smaller, a compositional ratio of In in the InGaN quantum well layer or the AlInGaN quantum well layer in the multiple quantum well layer is 3% or greater and 20% or smaller, a compositional ratio of Al in the AlInGaN quantum barrier layer or the AlGaN quantum barrier layer in the multiple quantum well layer is 1% or greater and 30% or smaller, and a band gap of the quantum well layer is smaller than a band gap of the quantum barrier layer.

The gallium nitride-based compound semiconductor device according to these aspects of the present invention can be manufactured through an MOCVD method. According to another aspect of the present invention, it is preferable that a manufacturing method comprises the steps of forming the buffer layer on the substrate at a temperature of 450° C. or higher and 600° C. or lower, sequentially forming the first GaN-based layer, the n-type GaN-based layer, and the n-type AlGaN layer on the buffer layer at a temperature of 1050° C. or higher and 1100° C. or lower, sequentially forming the second GaN-based layer and the multiple quantum well layer on the n-type AlGaN layer at a temperature of 800° C. or higher and 900° C. or lower, and sequentially forming the p-type AlGaN layer and the p-type GaN-based layer on the multiple quantum well layer at a temperature of 950° C. or higher and 1025° C. or lower.

According to another aspect of the present invention, it is preferable that the gallium nitride-based compound semiconductor device further comprises an n electrode which is connected to the n-type GaN-based layer, a p electrode which is connected to the p-type GaN-based layer, and a power supply which applies a voltage between the n electrode and the p electrode. According to another aspect of the present invention, it is preferable that the gallium nitride-based compound semiconductor device is used as a light source to realize a device which irradiates light having a wavelength of 400 nm or shorter. Because a device in which the gallium nitride-based compound semiconductor device according to the present invention is incorporated as a light source has a superior light emission efficiency at a short wavelength band (wavelength of 400 nm or shorter), such a device is applicable for uses which require a light source of a short wavelength.

BEST MODE FOR CARRYING OUT THE INVENTION

Preferred embodiments of the present invention will now be described referring to the drawings.

First Preferred Embodiment

Figure 1:
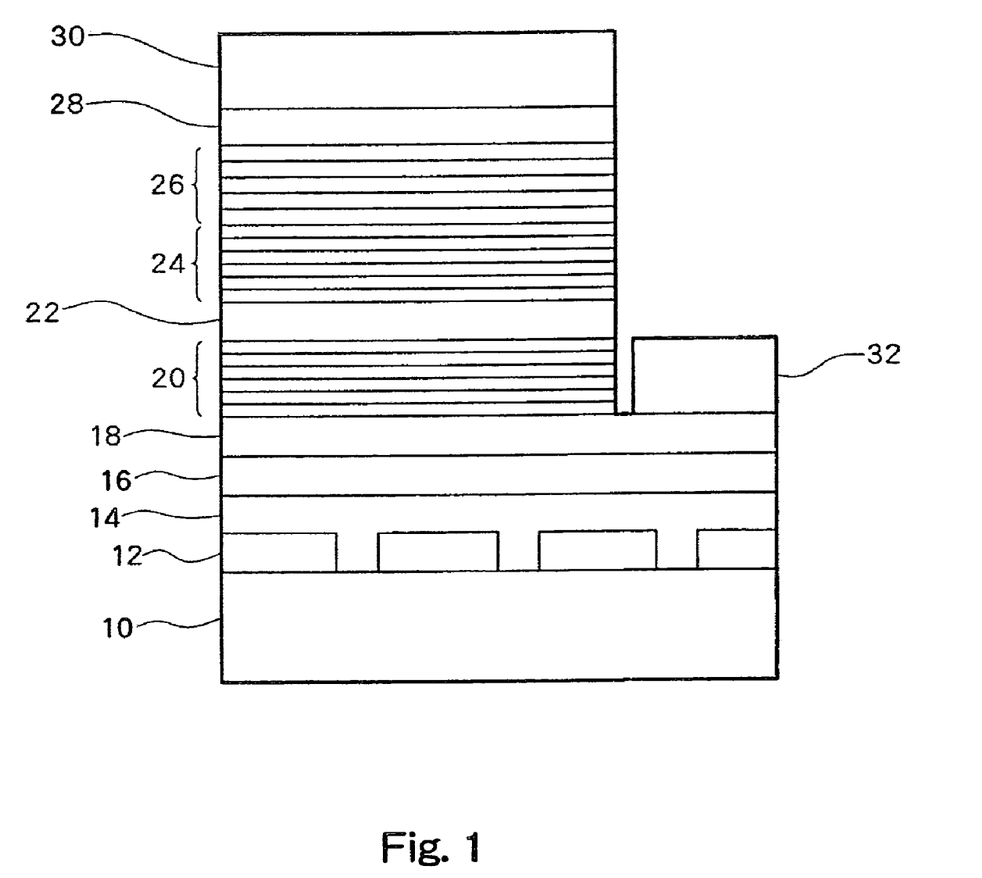
FIG. 1 is a diagram showing a structure of a gallium nitride-based compound semiconductor device.

FIG. 1 shows a structure of a light emitting element (LED) which is a GaN-based compound semiconductor according to a first preferred embodiment of the present invention. The light emitting element is manufactured by growing a plurality of layers on a substrate through an MOCVD method (Metal Organic Chemical Vapor Deposition). More specifically, the light emitting element is manufactured through the following processes. First, an MOCVD device will be briefly described, although the MOCVD device itself is well known in the art. A susceptor and a gas introduction tube are provided within a reaction tube. A substrate is placed on the susceptor and a material gas is supplied while the substrate is heated by a heater to let a reaction occur on the substrate. The gas introduction section is provided, for example, at two locations of the reaction tube. A material gas such as trimethyl gallium and silane gas is introduced from one location from a lateral direction of the substrate and mixture gas of hydrogen and nitrogen or the like is supplied from the other location via a permeable microporous member from above the substrate.

A sapphire c-surface substrate 10 is prepared, set on the susceptor of an MOCVD device at a normal pressure, and thermally treated in a hydrogen atmosphere for 10 minutes with a substrate temperature of 1100° C. Then, the temperature of the substrate 10 is reduced to 500° C. and an SiN buffer film 12 is discontinuously formed on the substrate by flowing monomethyl silane gas and ammonia gas for 100 seconds. The discontinuous SiN film 12 is provided in order to reliably reduce dislocations within the layer, but may be omitted in the present embodiment. Next, trimethyl gallium and ammonia gas are supplied while the temperature is maintained at 500° C. to form a GaN buffer layer 14 to a thickness of 25 nm. The GaN buffer layer 14 functions as a low temperature buffer layer. Then, the temperature is raised to 1075° C. and trimethyl gallium and ammonia gas are again supplied to form an undoped GaN layer 16 to a thickness of 2 µm. Monomethyl silane gas is added to the trimethyl gallium and ammonia gas to form a Si-doped n-GaN layer 18 to a thickness of 1 µm. The monomethyl silane gas is added to dope Si into GaN to form an n-type layer and a carrier density within the Si-doped n-GaN layer 18 is approximately $5 \times 10^{18}$ cm$^{-3}$.

Then, 50 pairs of Si-doped n-$Al_{0.1}Ga_{0.9}N$ (2 nm) and Si-doped n-GaN (2 nm) are alternately formed while the temperature of the substrate is maintained at 1075° C. to form an SLS (Strained Layer Superlattice) layer 20. AlGaN can be formed by supplying trimethyl aluminum in addition to the trimethyl gallium and ammonia gas (in practice, monomethyl silane gas is also supplied in order to dope Si). An average carrier density within the SLS layer 20 is $5 \times 10^{18}$ cm$^{-3}$.

Next, the substrate temperature is lowered to 830° C. and an undoped GaN layer 22 is formed to a thickness of 30 nm. Then, 7 pairs of undoped $In_{0.05}Ga_{0.95}N$ (1.5 nm) and undoped $Al_{0.1}In_{0.02}Ga_{0.88}N$ (9.5 nm) are alternately layered to form an MQW (multiple quantum well) light emitting layer 24. In this process, the InGaN layer is formed by supplying trimethyl gallium, trimethyl indium, and ammonia gas and the AlInGaN layer is formed by supplying trimethyl aluminum in addition to the trimethyl gallium, trimethyl indium, and ammonia gas. The MQW light emitting layer 24 comprises well layers and barrier layers which are alternately layered. The undoped InGaN layer functions as the well layer and the undoped AlInGaN layer functions as the barrier layer. A band gap of the well layer is set to be smaller than the band gap of the barrier layer. In the present embodiment, the well layer is InGaN layer, but it is also possible to form the well layer with AlInGaN. When both the well layer and the barrier layer are to be formed with AlInGaN, the Al compositions of the layers are adjusted such that the band gap of the well layer is smaller than the band gap of the barrier layer. The compositional ratio of Al in the well layer is preferably 0%-20%. The InGaN well layer of FIG. 1 represents a configuration in which the compositional ratio of Al is 0%. The compositional ratio of Al in the barrier layer is preferably 1%-30%.

After the MQW light emitting layer 24 is formed, the temperature of the substrate 10 is raised to 975° C. and 50 pairs of Mg-doped p-AlGaN (1.5 nm) and Mg-doped p-GaN (0.8 nm) are alternately formed to form a p-SLS layer 26. Then, a p-GaN layer 28 is formed to a thickness of 15 nm. Carrier concentrations in the p-SLS layer 26 and p-GaN layer 28 are $5 \times 10^{17}$ cm$^{-3}$ and $3 \times 10^{18}$ cm$^{-3}$, respectively.

The SLS layer 20 and the SLS layer 26 formed to sandwich the light emitting layer 24 function as clad layers for confining carriers.

After an LED wafer is manufactured through the above-described processes, the LED wafer is taken out from the MOCVD device, Ni (10 nm) and Au (10 nm) are sequentially vacuum-evaporated and layered on the surface, and a thermal treatment is applied in a nitrogen gas atmosphere containing 5% of oxygen at a temperature of 520° C. so that the metal film becomes a p transparent electrode 30. After the p electrode 30 is formed, a photoresist is applied on the surface, the p electrode 30 is etched using the photoresist as an etching mask to expose the n-GaN layer 18, Ti (5 nm) and Al (5 nm) are evaporated on the exposed n-GaN layer 18, and a thermal treatment is applied in a nitrogen gas for 30 minutes at a temperature of 450° C. to form an n electrode 32.

In FIG. 1, the SLS layer 20 corresponds to a first superlattice layer, the MQW light emitting layer 24 corresponds to a multiple quantum well layer, and the SLS layer 26 corresponds to a second superlattice layer. Furthermore, the undoped GaN layer 16 corresponds to a first GaN-based layer, the Si-doped n-GaN layer 18 corresponds to an n-type GaN-based layer, the undoped GaN layer 22 corresponds to a second GaN-based layer, and the p-GaN layer 28 corresponds to a p-type GaN-based layer.

Although not shown in FIG. 1, an Au pad for wire bonding having a thickness of 500 nm is formed on a part of the p electrode 30 and n electrode 32, a rearside surface of the substrate 10 is ground to a thickness of 100 µm, and chips are cut through scrubbing and are mounted to manufacture light emitting element devices (LED devices).

Table 1 shows a material, a range of composition, and a range of carrier concentration for each layer shown in FIG. 1.

TABLE 1

| MATERIAL OF LAYER | RANGE OF COMPOSITION | RANGE OF CARRIER CONCENTRATION (1/cm$^3$) |
|---|---|---|
| p$^+$GaN | | 1-50E17 |
| Mg-DOPED p-AlGaN/ Mg-DOPED p-GaN SLS | Al = 5-25% | 1-30E17 |

TABLE 1-continued

| MATERIAL OF LAYER | RANGE OF COMPOSITION | RANGE OF CARRIER CONCENTRATION (1/cm³) |
|---|---|---|
| AlInGaN/AlInGaN MQW | AlInGaN (WELL) (In = 3-20%, Al = 0-20%), AlInGaN (BARRIER) (Al = 1-20%, In = 0-10%) Compositions are selected such that a band gap of the well layer is smaller than a band gap of the barrier layer. | UNDOPED |
| UNDOPED GaN | | UNDOPED |
| Si-DOPED n-AlGaN/ Si-DOPED n-GaN SLS | Al = 5-25% | 1-8E18 |
| Si-DOPED n-GaN | | 1-8E18 |
| UNDOPED GaN | | UNDOPED |
| BUFFER LAYER | | UNDOPED |
| SiN BUFFER (may be omitted) | | |
| SAPPHIRE C-SURFACE SUBSTRATE | | |

In Table 1, the MQW light emitting layer 24 is shown as AlInGaN/AlInGaN MQW layer. In this representation, the former represents the well layer and the latter represents the barrier layer. In Table 1, it is important to note that the compositional ratios of Al in SLS layers 20 and 26 are 5% or greater and 25% or smaller, the compositional ratio of Al in the well layer of the MQW light emitting layer 24 is 0% or greater and 20% or smaller, the compositional ratio of In in the well layer is 3% or greater and 20% or smaller, the compositional ratio of Al in the barrier layer of the MQW light emitting layer 24 is 1% or greater and 20% or smaller, and the compositional ratio of In in the barrier layer is 0% or greater and 10% or smaller. Alternatively, the compositional ratio of Al in the barrier layer of the MQW light emitting layer 24 may be set to 1% or greater and 30% or smaller. Regarding a relationship between the composition of Al in the barrier layer and the compositions of Al in the SLS layer 20 and SLS layer 26, it is preferable that the compositional ratio of Al in the barrier layer is greater than the compositional ratio of Al in the SLS layers 20 and 26. Electrons and holes which are carriers recombine in the well layer of the MQW light emitting layer 24 and light is emitted. When the compositional ratio of Al in the barrier layer is increased, the band gap is increased, and consequently, the carriers can be efficiently confined in the well layer of the MQW light emitting layer 24 and the light emission efficiency can be improved. When the compositional ratio of Al in the barrier layer is increased, the effective band gap of the well layer of the MQW light emitting layer 24 is also increased.

Because the compositional ratio of Al of the well layer includes 0% and the compositional ratio of In in the barrier layer includes 0%, the following four combinations are possible as the materials for the MQW light emitting layer 24:

(a) InGaN well layer and AlGaN barrier layer;
(b) InGaN well layer and AlInGaN barrier layer;
(c) AlInGaN well layer and AlGaN barrier layer; and
(d) AlInGaN well layer and AlInGaN barrier layer.

In any of these combinations, the compositions are selected such that the band gap of the well layer is smaller than the band gap of the barrier layer. FIG. 1 shows a configuration of the combination (b).

Table 2 shows preferred thicknesses for the layers.

TABLE 2

| MATERIAL OF LAYER | PREFERRED THICKNESS |
|---|---|
| p⁺GaN | 5-50 nm |
| Mg-DOPED p-AlGaN/ Mg-DOPED p-GaN SLS | AlGaN (0.5-10 nm)/ GaN (0.5-5 nm) (20-100 PAIRS) |
| AlInGaN/AlInGaN MQW | AlInGaN (WELL) (1-5 nm)/ AlInGaN (BARRIER) (2-50 nm) |
| UNDOPED GaN | 5-100 nm |
| Si-DOPED n-AlGaN/ Si-DOPED n-GaN SLS | AlGaN (1-10 nm)/GaN (1-10 nm) (10-500 PAIRS) |
| Si-DOPED n-GaN | 500-10000 nm |
| UNDOPED GaN | 500-3000 nm |
| BUFFER LAYER | 10-40 nm |
| SiN BUFFER (may be omitted) | |
| SAPPHIRE C-SURFACE SUBSTRATE | |

As shown in Table 2, regarding the MQW light emitting layer 24, the thickness of the AlInGaN (or InGaN) well layer is 1 nm or greater and 5 nm or smaller and the thickness of the AlInGaN (or AlGaN) barrier layer is 2 nm or greater and 50 nm or smaller. The thickness of AlGaN in the SLS layer 20 is 1 nm or greater and 10 nm or smaller and the thickness of GaN in the SLS layer 20 is 1 nm or greater and 10 nm or smaller. The thickness of AlGaN in the SLS layer 26 is 0.5 nm or greater and 10 nm or smaller and the thickness of GaN in the SLS layer 26 is 0.5 nm or greater and 5 nm or smaller.

Regarding the other layers, the thickness of the GaN buffer layer 14 is 10 nm or greater and 40 nm or smaller, the thickness of the undoped GaN layer 16 is 500 nm or greater and 3000 nm or smaller (preferably 500 nm or greater and 2000 nm or smaller), the thickness of the Si-doped n-GaN layer 18 is 500 nm or greater and 10000 nm or smaller, the thickness of the undoped GaN layer 22 is 5 nm or greater and 100 nm or smaller, and the thickness of the p-GaN layer 28 is 5 nm or greater and 50 nm or smaller.

Table 3 shows more preferable thicknesses of these layers.

TABLE 3

| MATERIAL OF LAYER | MORE PREFERRED THICKNESS |
|---|---|
| p⁺GaN | 10-40 nm |
| Mg-DOPED p-AlGaN/Mg-DOPED p-GaN SLS | AlGaN (1-6 nm)/GaN (0.5-3 nm) (40-60 PAIRS) |
| AlInGaN/AlInGaN MQW | AlInGaN (WELL) (1-2 nm)/ AlInGaN (BARRIER) (6-20 nm) (5-10 PAIRS) |
| UNDOPED GaN | 20-40 nm |
| Si-DOPED n-AlGaN/ Si-DOPED n-GaN SLS | AlGaN (1.5-5 nm)/GaN (1.5-5 nm) (40-60 PAIRS) |
| Si-DOPED n-GaN | 1000-2000 nm |
| UNDOPED GaN | 1500-3000 nm |
| BUFFER LAYER | 25-35 nm |
| SiN BUFFER (may be omitted) | |
| SAPPHIRE C-SURFACE SUBSTRATE | |

As shown in Table 3, regarding the MQW light emitting layer 24, the thickness of the AlInGaN (or InGaN) well layer is 1 nm or greater and 2 nm or smaller and the thickness of the AlInGaN (or AlGaN) barrier layer is 6 nm or greater and 20 nm or smaller. The thickness of AlGaN in the SLS layer 20 is 1.5 nm or greater and 5 nm or smaller and the thickness of GaN in the SLS layer 20 is 1.5 nm or greater and 5 nm or smaller. The thickness of AlGaN in the SLS layer 26 is 1 nm or greater and 6 nm or smaller and the thickness of GaN in the SLS layer 26 is 0.5 nm or greater and 3 nm or smaller. Regarding the other layers, the thickness of the GaN buffer layer 14 is 25 nm or greater and 35 nm or smaller, the thickness of the undoped GaN layer 16 is 1500 nm or greater and 3000 nm or smaller (preferably, 1500 nm or greater and 2000 nm or smaller), the thickness of the Si-doped n-GaN layer 18 is 1000 nm or greater and 2000 nm or smaller, the thickness of the undoped GaN layer 22 is 20 nm or greater and 40 nm or smaller, and the thickness of the p-GaN layer 28 is 10 nm or greater and 40 nm or smaller.

Table 4 shows growth temperatures when the layers are grown using the MOCVD device.

TABLE 4

| MATERIAL OF LAYER | TEMPERATURE (° C.) |
| --- | --- |
| p+GaN | 950-1025 |
| Mg-DOPED p-AlGaN/Mg-DOPED p-GaN SLS | 950-1025 |
| AlInGaN/AlInGaN MQW | 800-900 |
| UNDOPED GaN | 800-900 |
| Si-DOPED n-AlGaN | 1050-1100 |
| Si-DOPED n-GaN SLS | |
| Si-DOPED n-GaN | 1050-1100 |
| UNDOPED GaN | 1050-1100 |
| BUFFER LAYER | 450-600 |
| SiN BUFFER | 450-600 |
| SAPPHIRE C-SURFACE SUBSTRATE | |

As shown in Table 4, the GaN buffer layer 14 is grown at a temperature of 450° C. or higher and 600° C. or lower, the undoped GaN layer 16 is grown at a temperature of 1050° C. or higher and 1100° C. or lower, the Si-doped n-GaN layer 18 is grown at a temperature of 1050° C. or higher and 1100° C. or lower, the SLS layer 20 or a single layer of the AlGaN layer 20 is grown at a temperature of 1050° C. or higher and 1100° C. or lower, the undoped GaN layer 22 is grown at a temperature of 800° C. or higher and 900° C. or lower, the MQW light emitting layer 24 is grown at a temperature of 800° C. or higher and 900° C. or lower, the SLS layer 26 or a single layer of the AlGaN layer 26 is grown at a temperature of 950° C. or higher and 1025° C. or lower, and the p-GaN layer 28 is grown at a temperature of 950° C. or higher and 1025° C. or lower.

A light emitting element thus manufactured was introduced into an integrating sphere, the p electrode 30 and the n electrode 32 were connected to a power supply, a current was supplied, and a total power of light emitted from the chip was measured. A light power of approximately 2 mW was obtained at a supplied current of 20 mA. The light emission wavelength was confirmed to be within a wavelength of 372 nm±5 nm, although the light emission wavelength slightly varies on the wafer surface of a diameter of 2 inches. The external quantum efficiency was approximately 3%.

The present inventors formed a number of wafers with different materials and thicknesses for the layers shown in FIG. 1, performed similar evaluations, and found that the restrictive conditions for the layers differ depending on the light emission wavelength. More specifically, when the light emission peak wavelength is 380 nm-400 nm, a light power of 1 mW or greater can be obtained when the thicknesses of the layers are in the ranges of preferred thicknesses as shown in Table 2.

When, on the other hand, the light emission peak wavelength is 365 nm-380 nm and the thicknesses of the layers are deviated from the ranges of preferred thicknesses as shown in Table 2, the light power is rapidly reduced to 0.1 mW or less and the light power became 1 mW or less when the thicknesses of the layers are deviated from the ranges of preferred thicknesses shown in Table 3. From these results, it was confirmed that the light emission efficiency in the short wavelength band (wavelength of 400 nm or shorter) can be improved by setting the thicknesses within the range shown in Table 2 or Table 3.

Figure 2:
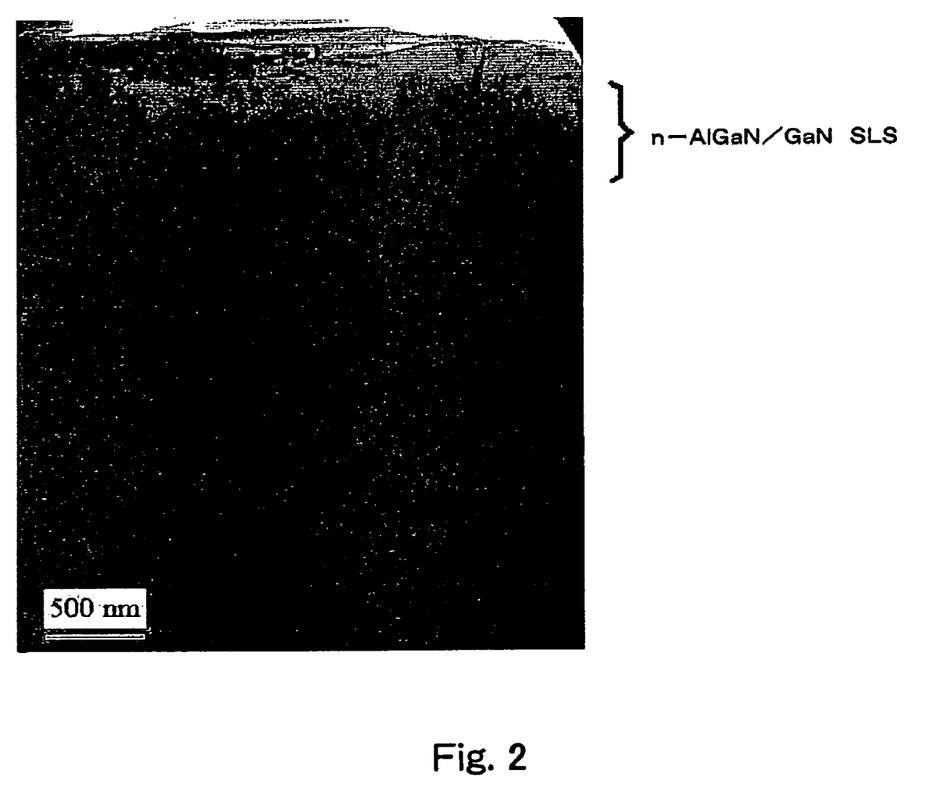
FIG. 2 is a diagram showing an electron microscope photograph of a cross section of a light emitting element.

A reason why the light emission efficiency can be improved may be considered as follows. FIG. 2 is an explanatory diagram showing an electron microscope photograph of a cross section of a light emitting element manufactured in the present embodiment. Upon detailed observation of the explanatory diagram of the electron microscope photograph of cross section, it can be seen that the dislocations are reduced at an interface between the n-GaN/AlGaN SLS layer 20 and the updoped GaN layer 22. It can be considered that because of distortions contained in the SLS layer 20 and the change in the growth temperature at this boundary, dislocations which are transferred from the lower layers are bent in the lateral direction and the dislocations in the MQW light emitting layer 24 formed immediately above are reduced. In other words, it can be considered that the dislocations in the MQW light emitting layer 24 can be inhibited by adjusting the compositions and thicknesses of the layers in the above-described ranges.

Figure 3:
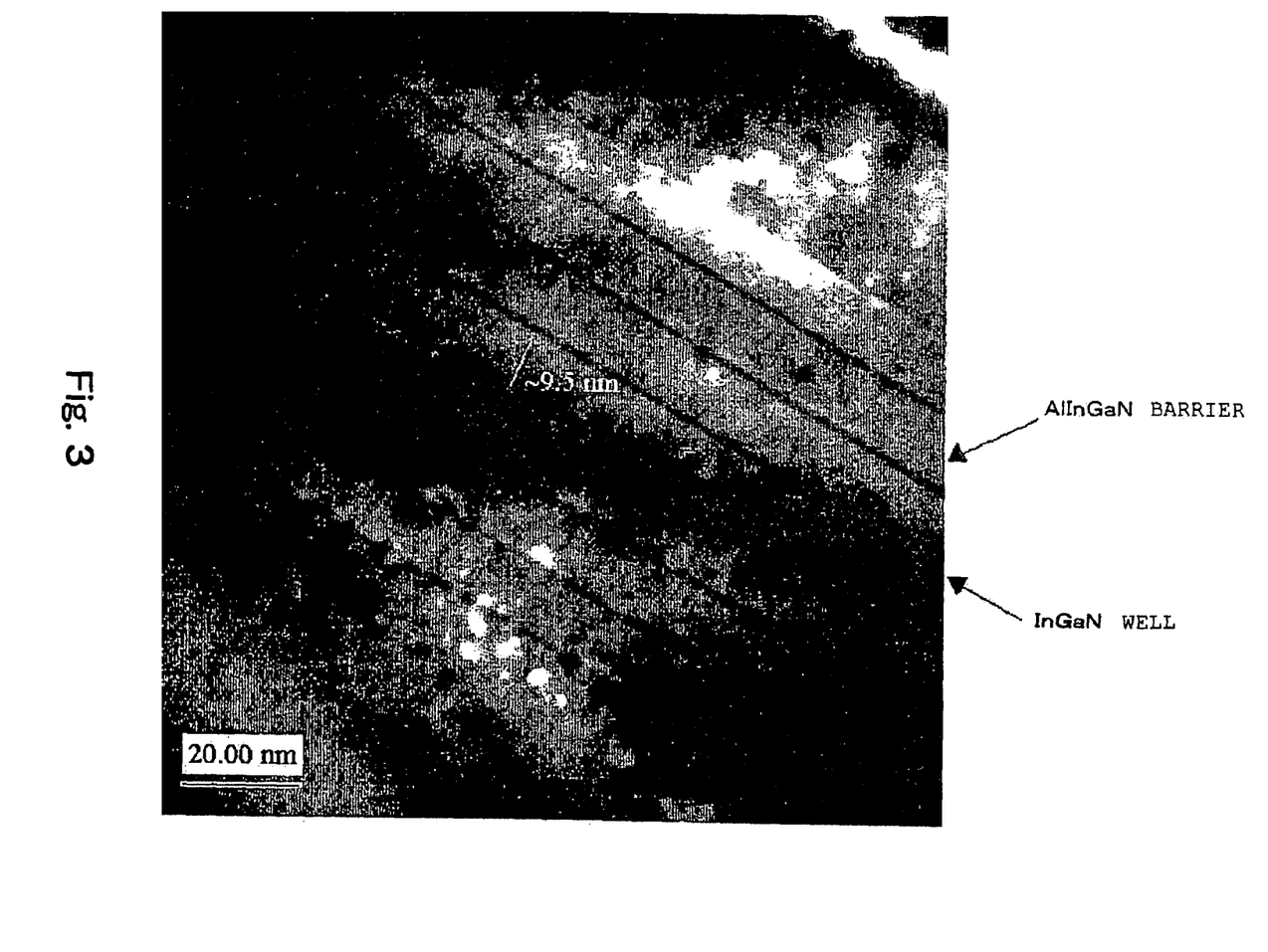
FIG. 3 is a diagram showing another electron microscope photograph of a cross section of a light emitting element.

Another reason why the light emission efficiency can be improved may be the compositional fluctuation of the light emitting layer 24. In the MQW light emitting layer 24 in which the AlInGaN (or InGaN) well layer and AlInGaN (or AlGaN) barrier layer are layered, the composition of In is low and compositional fluctuation of InGaN does not tend to occur. When compositional fluctuation occurs, light is emitted at a local region in which the composition of In is large, and, thus, the injected carriers are captured at the local region and cannot reach the dislocations. As a result, the efficiency is not reduced. However, because Al is added to the barrier layer, it can be considered that, by simultaneously increasing compositions of In and Al, the composition of In and Al can be increased while maintaining the light emission wavelength at a short wavelength, and, as a result, the compositional fluctuation is increased. FIG. 3 is an explanatory diagram showing an electron microscope photograph of a cross section. In FIG. 3, it can be seen that the wall layer of the light emitting layer 24 is uneven. In other words, it can be considered that, by adjusting the materials and compositional ratios in the MQW light emitting layer 24 in the above-described ranges, the compositional fluctuation can be increased and reduction in the light emission efficiency due to dislocations can be inhibited.

In this manner, by employing a layer structure as shown in FIG. 1 and setting the thicknesses of the layers to the ranges shown in Table 2 or Table 3, it is possible to obtain a high light emission efficiency.

The present inventors have found that it is possible to obtain a high light emission efficiency at a wavelength of 400 nm or shorter similar to the above by employing a single layer of AlGaN in place of the SLS layer 20 and a single layer of AlGaN in place of the SLS layer 26. More specifically, an AlGaN layer having a composition of Al of 5%-25% is formed to a thickness of 50 nm or greater and 500 nm or smaller, more preferably, 70 nm or greater and 300 nm or smaller in place of the SLS layer 20 and an AlGaN layer having a composition of Al of 5%-25% is formed to a thickness of 50 nm or greater and 500 nm or smaller, more preferably, 70 nm or greater and 200 nm or smaller in place of the SLS layer 26. The overall structure of the configuration in which single layers of AlGaN are used is: sapphire substrate 10/discontinuous film of SiN 12/GaN buffer layer 14/undoped GaN layer 16/Si-doped n-GaN layer 18/AlGaN layer 20/undoped GaN layer 22/MQW light emitting layer 24/AlGaN layer 26/p-GaN layer 28.

In this configuration also, the compositional ratios of Al are selected such that the band gap of the well layer of the MQW 24 is smaller than the band gap of the barrier layer. Moreover, it is preferable that the compositional ratio of Al in the barrier layer of the MQW 24 is selected to be larger than the compositional ratio of Al in the AlGaN layers 20 and 26. Specifically, it is preferable to set the compositional ratio of Al in the barrier layer of MQW 24 to approximately 30%.

The present inventors also manufactured a light emitting element in which the SiN film 12 shown in FIG. 1 is not formed, a GaN-based layer 16 having a structure of GaN layer/SiN layer/GaN layer with SiN inserted in the GaN layer is employed in place of the undoped GaN layer 16, 50 pairs of undoped AlGaN (1.7 nm) and Si-doped GaN (1.7 nm) are alternately formed as the SLS layer 20, an AlGaN layer (26 nm) is employed in place of the undoped GaN layer 22, 3 pairs of InGaN well layer (1.7 nm) and AlGaN barrier layer (13 nm) are alternately formed as the MQW light emitting layer 24, and 50 pairs of AlGaN (1.1 nm) and GaN (0.5 nm) are alternately formed as the SLS layer 26 and found that the light emission efficiency is high at a wavelength of 400 nm or shorter, similar to the above-described configuration. By inserting SiN in the GaN layer, dislocations in the GaN layer formed on the SiN layer are reduced and dislocations in the MQW light emitting layer 24 can be inhibited.

Table 5 shows a material, a range of composition, and a range of carrier concentration for each of the layers.

TABLE 5

| MATERIAL OF LAYER | RANGE OF COMPOSITION | RANGE OF CARRIER CONCENTRATION ($cm^{-3}$) |
| --- | --- | --- |
| p$^+$GaN (17 nm) | | 1-50E17 |
| AlGaN (1.1 nm)/ GaN (0.5 nm) (50 PAIRS) | Al = 5-25% | 1-30E17 |
| InGaN (WELL) (1.7 nm)/ AlGaN (BARRIER) (13 nm) (3 PAIRS) | InGaN (WELL) (In~5.5%, AlGaN (BARRIER) (Al~30%) | UNDOPED |
| AlGaN (26 nm) | Al~20% | UNDOPED |
| UNDOPED AlGaN (1.7 nm)/ Si-DOPED n-GaN (1.7 nm) SLS, (50 PAIRS) | Al~18% | 1-8E18 |
| Si-DOPED n-GaN | | 1-8E18 |
| UNDOPED GaN2 (800-1200 nm) | | UNDOPED |
| SiN HIGH TEMPERATURE BUFFER | | |
| UNDOPED GaN1 (800-1200 nm) | | UNDOPED |
| BUFFER LAYER (~25 nm) | | UNDOPED |
| SAPPHIRE C-SURFACE SUBSTRATE | | |

The compositional ratio of Al in the AlGaN barrier layer of the MQW light emitting layer 24 is 30% which is larger than the compositional ratio of Al of the SLS layer 20 which is approximately 18% and is larger than the compositional ratio of Al in the SLS layer 26 which is 5%-25%. When the composition of Al in AlGaN is increased, the crystal quality is degraded, and therefore, it is preferable that the upper limit of the composition of Al in the AlGaN barrier layer of the MQW light emitting layer 24 is approximately 30%.

The light emitting element according to the present embodiment has a high light emission efficiency at a wavelength of 400 nm or shorter, and thus, it is possible to manufacture various products using this characteristic. In the following description, example devices in which the light emitting element shown in FIG. 1 is used as a light source will be described.

Second Preferred Embodiment

When texts, objects, or the like are drawn by a commercially available black pen (fluorescent pen), the drawn objects cannot be seen under visible light illumination, but can be seen when an ultraviolet ray is irradiated onto the drawn objects. Although a color black pen (a color object appears when ultraviolet ray is irradiated) is also commercially available, in order to reproduce colors, the wavelength of the ultraviolet ray to be irradiated must be 400 nm or shorter, more precisely, 380 nm or shorter. In the related art, a light source such as a fluorescence black light or a mercury lamp is used. However, these light sources are large and consume large power and there is a problem in that a large-scale power supply is necessary.

When the light emitting element device (LED) as shown in FIG. 1 is used as a light source for reproducing the drawn objects, the device is small and can be driven by a battery. Objects drawn by a black pen were reproduced by irradiating light with LEDs having peak wavelengths of 400 nm, 385 nm, and 372 nm. The intensities of illuminated light were approximately 5 mW (400 nm), 3 mW (385 nm), and 1 mW (372 nm).

In the case of the 400 nm LED, although the objects appeared, the colors were not reproduced and the intensity of fluorescence was a very low level which can barely be seen. When light is irradiated by the 385 nm LED, a strong intensity of fluorescence which allows clear display of the shape of the objects was obtained, but the colors were not reproduced. The color reproducibility for red was particularly inferior. In the case of the LED of a wavelength of 372 nm, on the other hand, although the irradiation intensity was 1 mW, which is low, the fluorescence was strong and allowed the objects to be seen in a bright room and the three primary colors were accurately reproduced.

From these results, it was confirmed that the LED having a wavelength band of 365 nm-380 nm was suitable as a light source for reproducing objects drawn by a black pen (fluorescent pen) which is commercially available at low cost. By incorporating the LED of the present embodiment along with a battery into products such as a key holder, a black pen, and an eraser, it is possible to obtain a system for drawing invisible text and drawings which can be easily reproduced.

Third Preferred Embodiment

The LED according to the present embodiment was irradiated onto the skin of a human body for a short period of time and the effects of the irradiation were observed. Light was irradiated from LEDs having peak wavelengths of 400 nm (5 mW), 385 nm (3 mW), and 372 nm (1 mW) onto the skin for 10 minutes and changes in the skin (commonly referred to as "tanning") were observed. As a result, it was found that in the case of the LED of peak wavelength of 400 nm (5 mW), there was almost no effect while there was some change in the case of the LED of 385 nm (3 mW). In the case of the LED of 372 nm (1 mW), on the other hand, there was significant tanning. These results show that the LED in the wavelength band of 365 nm-380 nm causes tanning of the human body. Tanning devices were manufactured using the LED as a light source. A tanning device which allows tanning of a spot of a diameter of 5 mm and a tanning device in which LEDs were placed on a straight line having a length of 3 cm to allow tanning of line shape were manufactured and experiments were performed. Both devices cause tanning by irradiating light for 10 minutes. It was also found that when the light is irradiated for 30 minutes or longer, the skin was damaged.

In the related art, because tanning devices use ultraviolet lamps, these tanning devices were well suited for usage with a large irradiation area, but not for tanning of only a small region, and required, for example, that the parts other than the parts for which tanning is desired be covered by a towel or the like. The tanning device of the present embodiment, on the other hand, can create arbitrary tanning of spots and lines.

Fourth Preferred Embodiment

Light was irradiated onto skin to which a commercially available UV-cut cosmetic (SPF50+PA+++) was applied by a tanning device of the third preferred embodiment in which an LED having a peak wavelength of 372 nm (1 mW) was equipped as the light source. As a result, it was confirmed that the degree of tanning was very small compared to the case in which the UV-cut cosmetic is not applied. As described, the LED of the present embodiment can be used as a device for evaluating performance of an UV-cut cosmetic.

In the related art, this type of examination device was large and a broad skin surface is required for observing the effects. As described in the above-described preferred embodiments, the examination device of the present embodiment can cause tanning of an arbitrary shape of a spot or line or an arbitrary part. Therefore, the examination device of the present embodiment allows observation of degree of tanning for each part of a human body or to observe long-term irradiation effects by carrying the examination device.

Fifth Preferred Embodiment

A light accumulating material is used in a dial plate of a clock and signs such as evacuation guides or the like. This configuration takes advantage of a mechanism where when light is irradiated onto the light accumulating agent, the fluorescence continues even after the light is extinguished, to allow text or the like to be read in darkness. In recent years, the light accumulating period is elongated and the three primary colors can be displayed. For example, a short remaining light type device in which zinc sulfide and copper are combined and a long remaining light type device in which strontium aluminate and a rare earth metal are combined are known. The sensitivity of such a light accumulating agent is typically at a wavelength of 400 nm or shorter. Therefore, by combining the light accumulating agent and the LED of the present embodiment, it is possible to manufacture a display device having very low power consumption in which an operation to irradiate light for a short period of time and an operation to extinguish the light are repeated. It is also possible to create a (non-volatile) display device for emergencies in which the display does not disappear when the power supply is switched off.

Display devices were manufactured by combining LEDs having peak wavelengths of 400 nm (5 mW), 385 nm (3 mW), and 372 nm (1 mW) and light accumulating agents of three primary colors. The light accumulating agent was processed in a plate-like shape, light of the LED of the present embodiment was irradiated from the rearside surface, and the light emission from the front surface was observed. A cycle of irradiation of 10 minutes and termination of irradiation for a predetermined period of time was repeated. Even after the irradiation was terminated for 30 minutes, light emission from the light accumulating agent was observed in a room having a brightness similar to that of an ordinary office room. In total darkness, light emission from the light accumulating agent was observed even after the light was extinguished for approximately 1 hour. Similar advantages were obtained for all wavelengths, and the strongest remaining light was observed when an LED having a peak wavelength of 400 nm (5 mW) was used as the light source.

As described, with a display device which uses an LED of a wavelength band of 365 nm-400 nm and a light accumulating agent, it is possible to significantly reduce the power consumption compared to the display devices of the related art.

The reproducibility of colors were also observed. Light from the LEDs of the peak wavelength of 400 nm (5 mW) and of 385 nm (3 mW) are observed by the naked eye in blue color-purple color. Therefore, when red light is emitted from the light accumulating agent, the color of the LED and the color of the light from the light accumulating agent are mixed, and pure red cannot be reproduced. This is similar to green. Light from the LED of the peak wavelength of 372 nm (1 mW), on the other hand, is almost invisible to the naked eyes, and therefore, it is possible to accurately reproduce three primary colors. Therefore, a display device in which an LED of a wavelength band of 365 nm-380 nm is used as a light source and a light accumulating agent is used has a low power consumption and can achieve a full-color display.

Sixth Preferred Embodiment

A compound eye of an insect such as a moth has a peak sensitivity at a wavelength of 360 nm. An extermination device for insects using an ultraviolet lamp which takes advantage of this characteristic is commercially available. An ultraviolet lamp is mounted on a street light and an insect extermination device is placed near the ultraviolet lamp. Because the ultraviolet lamp also emits visible light, the ultraviolet lamp is generally bright. There is also a problem in that the power consumption is high. The LED of the present embodiment was used as the light source for attracting the insects. The peak wavelength was 372 nm. The LED is placed in darkness and gathering of insects was observed. At the same time, a mercury lamp of 2 W was placed at a different location for comparison. In order to reduce the power consumption of the LED and to increase the light emission peak intensity, the LED was driven with a pulse having a peak current of 200 mA, a peak power of approximately 10 mW, a pulse width of 10 mS, and a repetition frequency of 10 Hz (average power of 1 mW). Although the light power was smaller for the LED, it was observed that more insects gathered around the LED. The mercury lamp was observed by the naked eye as blue color-purple color, but the LED was almost invisible to the naked eye. From these results, it can be seen that the LED having a wavelength band of 365 nm-380 nm can be used as a light source for collecting insects.

A device was manufactured in which a lamp of a commercially available insect extermination device was changed to the LED. 200 LEDs of a wavelength of 372 nm were used and driven by a pulse similar to the above-described experiment. As a result, it was possible to exterminate approximately the same number of insects in one night compared to the original device. The insect extermination device in which the LED of the present embodiment is used as the light source has advantages that the power consumption is low and the degree of freedom for layout of the light source is increased because the LED is small. In addition, because the light is almost invisible to the naked eye, it is possible to use this device in an environment in which illumination is not desired.

Preferred embodiments of the present invention have been described. These preferred embodiments, however, are only exemplary, and other devices may be created using the LED of the present invention. For example, the present invention can be applied to a device for judging paper currency or testing for forgery of paper currency, or for cleaning air or water using a photocatalytic effect obtained by irradiating light on titanium oxide.

In the embodiments, it is possible to use an AlGaN layer in place of the GaN layer 16 and to use an n-type AlGaN layer in place of the n-type GaN layer 18. Moreover, in the embodiments, it is possible to use an InGaN layer in place of the GaN layer 22 and ap-type InGaN layer in place of the p-type GaN layer 28. The GaN-based layer includes, in addition to the GaN layer, An AlGaN layer and an InGaN layer in which the Ga in GaN is replaced by Al or In.

The invention claimed is:

1. A gallium nitride-based compound semiconductor device comprising:
   a substrate;
   a first superlattice layer which is formed above the substrate and in which an n-type AlGaN layer and an n-type GaN layer are alternately layered;
   a multiple quantum well layer which is formed above the first superlattice layer and in which a GaN-based quantum well layer and a GaN-based quantum barrier layer are alternately layered;
   a second superlattice layer which is formed above the multiple quantum well layer and in which a p-type AlGaN layer and a p-type GaN layer are alternately layered;
   a buffer layer, a first GaN-based layer which is formed above the buffer layer, and an n-type GaN-based layer which is formed above the first GaN-based layer are provided between the substrate and the first superlattice layer;
   a second GaN-based layer is provided between the first superlattice layer and the multiple quantum well layer; and
   a p-type GaN layer is provided above the second superlattice layer;
   wherein the first GaN-based layer has a structure in which an SiN layer is inserted in a GaN layer, and
   the second GaN-based layer has an AlGaN layer.

2. A gallium nitride-based compound semiconductor device according to claim 1, wherein
   a compositional ratio of Al in the GaN-based quantum barrier layer in the multiple quantum well layer is larger than compositional ratios of Al in the first superlattice layer and the second superlattice layer.

3. A gallium nitride-based compound semiconductor device according to claim 1, wherein
   each of compositional ratios of Al in the AlGaN layers in the first superlattice layer and in the second superlattice layer is 5% or greater and 25% or smaller;
   a compositional ratio of In in the InGaN quantum well layer or the AlInGaN quantum well layer in the multiple quantum well layer is 3% or greater and 20% or smaller;
   a compositional ratio of Al in the AlGaN quantum barrier layer or the AlInGaN quantum barrier layer in The multiple quantum well layer is 1% or greater and 30% or smaller; and
   a band gap of the quantum well layer is smaller than a band gap of The quantum barrier layer.

4. A gallium nitride-based compound semiconductor device according to claim 1, wherein
   each of thicknesses of the AlGaN layer and the GaN layer in the first superlattice layer is 1 nm or greater and 10 nm or smaller;
   a thickness of the quantum well layer in the multiple quantum well layer is 1 nm or greater and 5 nm or smaller;
   a thickness of the quantum barrier layer in the multiple quantum well layer is 2 nm or greater and 50 nm or smaller;
   a thickness of the AlGaN layer in the second superlattice layer is 0.5 nm or greater and 10 nm or smaller; and
   a thickness of the GaN layer in the second super lattice layer is 0.5 mu or greater and 5 nm or smaller.

5. A gallium nitride-based compound semiconductor device according to claim 1, wherein
   a thickness of the first GaN-based layer is 500 nm or greater and 3000 nm or smaller;
   a thickness of the n-type GaN-based layer is 500 nm or greater and 10000 nm or smaller;
   each of thicknesses of the AlGaN layer and the GaN layer in the first superlattice layer is 1 mm or greater and 10 nm or smaller;
   a thickness of the second GaN-based layer is 5 nm or greater and 100 nm or smaller;
   a thickness of the quantum well layer in the multiple quantum well layer is 1 nm or greater and 5 nm or smaller;
   a thickness of the quantum barrier layer in the multiple quantum well layer is 2 nm or greater and 50 nm or smaller;
   a thickness of the AlGaN layer in the second superlattice layer is 0.5 nm or greater and 10 nm or smaller;
   a thickness of the GaN layer in the second superlattice layer is 0.5 nm or greater and 5 nm or smaller; and
   a thickness of the p-type GaN-based layer is 5 nm or greater and 50 nm or smaller.

6. A gallium nitride-based compound semiconductor device according to claim 1, wherein
   each of thicknesses of the AlGaN layer and the GaN layer in the first superlattice layer is 1.5 nm or greater and 5 nm or smaller;
   a thickness of the quantum well layer in the multiple quantum well layer is 1 nm or greater and 2 nm or smaller;
   a thickness of the quantum barrier layer in the multiple quantum well layer is 6 nm or greater and 20 nm or smaller;
   a thickness of the AlGaN layer in the second superlattice layer is 1 nm or greater and 6 nm or smaller, and
   a thickness of the GaN layer in the second superlattice layer is 0.5 nm or greater and 3 nm or smaller.

7. A gallium nitride-based compound semiconductor device according to claim 1, wherein
a thickness of the first GaN-based layer is 1500 nm or greater and 3000 nm or smaller;
a thickness of the n-type GaN-based layer is 1000 nm or greater and 2000 nm or smaller;
each of thicknesses of the AlGaN layer and the GaN layer in the first superlattice layer is 1.5 nm or greater and 5 nm or smaller;
a thickness of the second GaN-based layer is 20 nm or greater and 40 nm or smaller;
a thickness of the quantum well layer in the multiple quantum well layer is 1 nm or greater and 2 nm or smaller;
a thickness of the quantum barrier layer in the multiple quantum well layer is 6 nm or greater and 20 nm or smaller;
a thickness of the AlGaN layer in the second superlattice layer is 1 nm or greater and 6 nm or smaller;
a thickness of the GaN layer in the second superlattice layer is 0.5 nm or greater and 3 nm or smaller; and
a thickness of the p-type GaN-based layer is 10 nm or greater and 40 nm or smaller.

8. A method for manufacturing a gallium nitride-based compound-semiconductor device according to claim 1, wherein
the buffer layer is formed on the substrate at a temperature of 450° C. or higher and 600° C. or lower;
the first GaN-based layer, the n-type GaN-based layer, and the first superlattice layer are sequentially formed on the buffer layer at a temperature of 1050° C. or higher and 1100° C. or lower;
the second GaN-based layer and the multiple quantum well layer are sequentially formed on the first superlattice layer at a temperature of 800° C. or higher and 900° C. or lower; and
the second superlattice layer and the p-type GaN-based layer are sequentially formed on the multiple quantum well layer at a temperature of 950° C. or higher and 1025° C. or lower.

9. A gallium nitride-based compound semiconductor device according to claim 1, further comprising:
an n electrode which is connected to the n-type GaN-based layer;
a p electrode which is connected to the p-type GaN-based layer; and
a power supply which applies a voltage between the n electrode and the p electrode.

* * * * *

UNITED STATES PATENT AND TRADEMARK OFFICE
CERTIFICATE OF CORRECTION

| | | |
|---|---|---|
| PATENT NO. | : 7,372,066 B2 | Page 1 of 1 |
| APPLICATION NO. | : 10/516703 | |
| DATED | : May 13, 2008 | |
| INVENTOR(S) | : Hisao Sato et al. | |

It is certified that error appears in the above-identified patent and that said Letters Patent is hereby corrected as shown below:

In the Claims:

In Claim 3, column 16, line 9, "The" should be --the--.

In Claim 3, column 16, line 13, "The" should be --the--.

In Claim 4, column 16, line 28, "0.5 mu" should be --0.5 nm--.

In Claim 5, Column 16, line 36, "1 mm" should be --1nm--.

Signed and Sealed this

Fifth Day of August, 2008

JON W. DUDAS
*Director of the United States Patent and Trademark Office*